United States Patent
Jochmann et al.

(10) Patent No.: US 11,500,231 B2
(45) Date of Patent: Nov. 15, 2022

(54) SYSTEMS AND METHODS FOR MODULATION CONTROL OF A CAMERA FILTER DEVICE

(71) Applicant: SMR Patents S.à.r.l., Luxembourg (LU)

(72) Inventors: Thomas Jochmann, Stuttgart (DE); Andreas Herrmann, Stuttgart (DE)

(73) Assignee: SMR Patents S.à.r.l., Luxembourg (LU)

( * ) Notice: Subject to any disclaimer, the term of this patent is extended or adjusted under 35 U.S.C. 154(b) by 487 days.

(21) Appl. No.: 16/636,190

(22) PCT Filed: Jul. 27, 2018

(86) PCT No.: PCT/EP2018/070461
§ 371 (c)(1),
(2) Date: Feb. 3, 2020

(87) PCT Pub. No.: WO2019/025318
PCT Pub. Date: Feb. 7, 2019

(65) Prior Publication Data
US 2020/0292857 A1 Sep. 17, 2020

(30) Foreign Application Priority Data
Aug. 4, 2017 (DE) ...................... 10 2017 117 765.5

(51) Int. Cl.
*G02F 1/09* (2006.01)
*G01R 33/032* (2006.01)
*G02F 1/1335* (2006.01)

(52) U.S. Cl.
CPC ............. *G02F 1/09* (2013.01); *G01R 33/032* (2013.01); *G02F 1/133509* (2013.01)

(58) Field of Classification Search
None
See application file for complete search history.

(56) References Cited

U.S. PATENT DOCUMENTS

| 5,200,793 A | 4/1993 | Ulich et al. |
| 7,777,787 B2 | 8/2010 | Hakola et al. |
| 2012/0038892 A1* | 2/2012 | Kurtz .................. H04N 9/3105 353/121 |

FOREIGN PATENT DOCUMENTS

| WO | WO 2013/055246 A2 | 4/2013 |
| WO | WO 2016/209877 A1 | 12/2016 |

OTHER PUBLICATIONS

International Search Report dated Oct. 23, 2018 of International application No. PCT/EP2018/070461.
(Continued)

*Primary Examiner* — Ashok Patel
(74) *Attorney, Agent, or Firm* — Jones Day

(57) ABSTRACT

A modulation control method for a filter device for avoiding flicker appearing in streamed video images before acquiring images, includes setting the exposure time to be equal or longer than an oscillating light source's period duration or to be as long as possible between two frames in the image acquisition of streamed video images, polarizing of incoming light in a first polarizer to turn into polarized light with a first polarization, altering the polarization of the light with the first polarization in an electro- or magneto-optic modulator by an angle α to turn into light with a second polarization, and reducing an amount of light with the second polarization in a second polarizer.

25 Claims, 1 Drawing Sheet

(56) References Cited

OTHER PUBLICATIONS

Written Opinion dated Oct. 23, 2018 of International application No. PCT/EP2018/070461.

* cited by examiner

SYSTEMS AND METHODS FOR MODULATION CONTROL OF A CAMERA FILTER DEVICE

CROSS-REFERENCE TO RELATED APPLICATIONS

This application is a National Stage Entry of International Patent Application No. PCT/EP2018/070461, filed Jul. 27, 2018, which claims the benefit of foreign priority to German Patent Application No. 10 2017 117 765, filed Aug. 4, 2017, each of which is herein incorporated by reference in its entirety for all purposes.

BACKGROUND

1. Field of the Invention

The present disclosure relates to a modulation control method for a filter device, an electro- or magneto-optic modulated anti-flicker filter device, a camera system with such a filter device, and a rear view device of a motor vehicle with such a camera system.

2. Related Art

Flicker of artificial light sources in videos originates from the fact, that these light sources emit light with oscillating luminance. Amongst the affected light sources are street lights, traffic lights and car lights, i.e., lights, that are highly important for motor traffic. These lights appear steady to the human observer, because the human eye can only resolve separate light pulses up to a frequency of approximately 60 Hz and most supposedly-steady artificial light sources have a frequency of 85 Hz and higher.

Such flicker is a known problem of streamed video images and is further defined by reference to FIG. 1. In detail, FIG. 1 compares a light intensity time diagram 10 of an oscillating light source with alternating high intensity 13a and low intensity 13b intervals of the same time length with two other time diagrams 11 and 12 that illustrate the effect of different light exposure times of a camera capturing images of said light source with a frame rate that is below the light source frequency. Each of the diagrams 11 and 12 depict an episode of image acquisitions 14a to 14c and 15a to 15c, respectively, at different points in time, with an identical initiation time at 14a (14b, 14c) and 15a (15b, 15c), but with different exposure times. In diagram 11 the exposure time for image acquisitions 14a, 14b, 14c is a fraction of the light source's period duration, while in diagram 12 the exposure time of image acquisitions 15a, 15b, 15c is equal to the light source's period duration, with the following result:

During the image acquisition episode 14a to 14c, the acquisition 14a is performed at a high intensity interval of the light source, the acquisition 14b is performed at a low intensity interval, and the acquisition 14c is performed in part at a low and in part at a high intensity interval. Thus the light source appears on the images with different intensities and seems to flicker, even when the average intensity of the light source is steady.

During image acquisition episode 15a to 15c all image acquisitions 15a to 15c are performed in part at high and in part at low intensity intervals and capture the same amount of light, so flicker does not appear. However, due to a relatively long exposure time an overexposure of the image acquisitions 15a to 15c is put up with.

State of the art cameras are incapable of recording the true signal path of the light intensity as they have a relatively small frame rate and therewith under sample said signal. When capturing images of an oscillating light source with an exposure time much shorter than the period duration of the light oscillation, the captured light intensity strongly depends on the point in time of image acquisition, as illustrated in FIG. 1. Furthermore, if the exposure time is much shorter than the time between two frames, there are large gaps, where no information is retrieved. In videos this often leads to a fluctuating brightness of the light sources within the scene. These fluctuations—referred to as 'flicker'—can be disturbing and distracting to both the human observer and machine vision systems. Light sources almost randomly light up in one frame and stay dark in subsequent frames. Thus, there is the danger that the information about the average intensity of the light source gets lost. But it is this average intensity which corresponds to the perception of human eyes.

U.S. Pat. No. 4,546,248 A describes a wide dynamic range video system for significantly attenuating bright areas in the image of a scene. Said system comprises:
 a liquid crystal light valve means adapted to receive a linearly polarized input light pattern and therefrom produce a linearly polarized output light pattern and having control means adapted to variably and selectively rotate the polarization vectors of light in said output light pattern;
 a first lens means for collecting light from a viewing scene and focusing the same on said light valve means as an input light;
 a first polarizer means adapted to linearly polarize said input light;
 a viewing means for viewing the output light from said light valve means;
 a second polarizer means to modify said output light in response to the degree of rotation of polarization vectors.

The viewing means is being adapted to provide a control signal to the light valve means for causing selective rotation of the polarization vectors of the output light pattern whereby the second polarizer means selectively attenuates the light received by the viewing means.

U.S. Pat. No. 7,777,787 B2 describes a method, comprising:
 determining whether a flicker light source is present;
 determining whether at least one predetermined exposure condition is met;
 conditionally activating an optical intensity block in an electronic device to optically attenuate a video image and provide an optically attenuated video image, where the optical intensity reducing block is activated if both the flicker light source is determined to be present and the at least one predetermined exposure condition is determined to be met and where the optical intensity reducing block is not activated if either the flicker light source is determined not to be present or the at least one predetermined exposure condition is determined not to be met; and
 generating from the optically attenuated video image, using an exposure time substantially equal to or a multiple of an inverse of a flicker frequency, a video signal of the optically attenuated video image.

WO 2016/209877 A1 describes a system and a method for processing streamed video images to correct for flicker of amplitude-modulated lights. A display system is provided for a vehicle equipped with a camera for supplying streamed video images of a scene rearward of the vehicle, with said display system comprising an image processing unit for receiving and processing the streamed video images and a display for displaying the processed streamed video images. For processing of the streamed video images, said image processing unit is configured to:

first detect amplitude-modulated light sources in the streamed video images,
second classify said light sources into at least two classes where a first class of said light sources having a flicker not perceivable by the human eye when viewed directly, and a second class of said light sources having a flicker that is perceivable by the human eye, such as turn signals or emergency vehicle lights,
third track said light sources through image frames of the streamed video images, and
fourth modify the streamed video images in which a said light source is detected that is classified in the first class to correct for flicker, so that when the processed streamed video images are displayed, each of said detected and classified in the first class light source appears to have no perceivable flicker.

The known software-based method does not address the cause of flicker, but rather attempts to regain lost information about the true behavior of amplitude-modulated lights, that comes along with some time delay. Additionally, it accepts some misinterpretation during a classification step so that a displayed processed streamed video images might provide a distorted view of a scene. In addition, as the light source itself needs to be detected, flicker appearing in a scene that is illuminated by an amplitude-modulated light source or light reflections from said light is not sufficiently corrected.

SUMMARY

In an aspect, a modulation control method for a filter device for avoiding flicker appearing in streamed video images before acquiring images, includes: setting the exposure time to be equal or longer than an oscillating light source's period duration or to be as long as possible between two frames in the image acquisition of streamed video images, polarizing of incoming light in a first polarizer to turn into polarized light with a first polarization, altering the polarization of the light with the first polarization in an electro- or magneto-optic modulator by an angle α to turn into light with a second polarization, reducing an amount of light with the second polarization in a second polarizer, with the remaining intensity of the outgoing light $I_2$ being $I_2=I_1 \cos^2\beta$, wherein $I_1$ is the light intensity before passing the second polarizer and β is the angle between the polarization orientation of the light and the polarization orientation of the second polarizer.

The polarizing step within the first polarizer can be accompanied by an absorption of light with the first polarization, in particular to 0.5 of its initial intensity.

The step of altering the polarization within the electro- or magneto-optic modulator can be accompanied by an absorption of light depending on the transmittance τ of the material of the electro- or magneto-optic modulator.

It is preferred that the altering of the first polarization depends on a voltage or current applied to the modulator, with preferably the step of altering the first polarization comprising the following steps: capturing the outgoing light with a camera device, in particular with a maximal exposure time between subsequent image acquisitions, detecting the amount of captured outgoing light during an image acquisition, in particular with an auto exposure unit, and applying a voltage or current to the electro- or magneto-optic modulator, in particular by a power supply driver, depending on the detected amount of captured outgoing light.

It is proposed that the voltage or current applied to the electro- or magneto-optic modulator is controlled by the auto exposure unit to alter the polarization of the light passing the electro- or magneto-optic modulator and thereby tune the amount of outgoing light.

The step of reducing the amount of light with the second polarization can be accompanied by an absorption of light.

The light intensity can be controlled by the absorption of the light with the first polarization and/or the light with the second polarization, preferably step-less (continuously attenuated) or step-wise (chopped).

Further, it is preferred that during the step-wise control of the light intensity pulse frequency and/or duty cycle of the respective steps is controlled.

In another aspect, an electro- or magneto-optic modulated anti-flicker filter device, in particular in form of an electro- or magneto-optic light intensity filter, suited to perform a modulation control method includes a first polarizer, an electro- or magneto-optic modulator, and a second polarizer.

It is preferred that the electro- or magneto-optic modulator comprises a Pockels cell, Kerr cell, Liquid Crystal cell, or a cell utilizing the magneto-optic Faraday effect, the Voigt effect or the Cotton-Mouton effect.

It is also preferred that the first polarizer comprises a linear absorptive polarizing filter and/or the second polarizer comprises a linear absorptive polarizing filter.

The first polarizer and the second polarizer can have the same polarization orientation.

In another aspect, a camera system includes at least one camera device and a filter device, wherein at least one auto exposure unit is connected to and/or part of the at least one camera device, with the auto exposure unit preferably being connected to a power supply driver.

In another aspect, a rear view device for a motor vehicle includes a camera system.

Thus, flicker in streamed video images is prevented by setting the exposure time to be equal or longer than the light source's period duration or to be as long as possible between two frames and dynamically reduce the amount of incoming light to prevent overexposure under bright light conditions with an electro- or magneto-optic light intensity filter and a modulation control method of said filter.

The electro- or magneto-optic light intensity filter of includes two polarizers, in particular linear absorptive polarizing filters, with an electro- or magneto-optic polarization modulator, such as a Pockels cell, a Kerr cell, a Liquid Crystal cell, or a cell utilizing the magneto-optic Faraday effect, the Voigt effect or the Cotton-Mouton effect, set in between the two polarizers. The first polarizer absorbs incoming unpolarized light, i.e., light with a uniform mixture of linear polarizations at all possible angles, that does not correspond to the polarization determined by the orientation of the first polarizer. Thereby the intensity of the remaining polarized light, $I_1$, is about half of the initial intensity of the unpolarized light. When the light passes the electro- or magneto-optic polarization modulator, it is attenuated depending on the modulator's transmittance τ. Thus, after the polarizer and the modulator, the initial intensity, $I_0$, is decreased as follows:

$$I_1 = 0.5 \cdot \tau \cdot I_0.$$

The polarization of the light having passed the first polarizer can be altered via the electro- or magneto-optic polarization modulator by an angle α continuously and linearly or quadratically related to an applied voltage or current, depending on the type of modulator. The second polarizer following the electro- or magneto-optic polarization modulator absorbs the amount of polarized light that does not correspond to the polarization determined by the orientation of the second polarizer. According to Malus's law, the intensity of outgoing light having passed the second polarizer, $I_2$, is given by the relation $I_2 = I_1 \cos^2 \beta$, wherein $I_1$ is the light intensity before passing the second polarizer and $\beta$ is the angle between the polarization orientation of the light and the polarization orientation of the second polarizer.

In a preferred setup of the filter device the polarization orientation of the first polarizer and the second polarizer are the same, so that no polarization modulation is needed for light transmission without additional intensity loss after passing the first polarizer, except of the loss through the transmittance τ of the electro- or magneto-optic modulator. In said setup the modulation angle α corresponds to the angle β between the polarization orientation of the polarized light and the polarization orientation of the second polarizer. Accordingly, the intensity of the outgoing light, $I_2$, in relation to the intensity of the incoming light, $I_0$, is given by the relation:

$I_2 = 0.5 \cdot \tau \cdot I_0 \cos^2 \alpha$.

The overall opacity of the chain of first polarizer, electro- or magneto-optic polarization modulator, and second polarizer is electrically tuned and the respective attenuation can be adjusted step-less, i.e., continuously, or step-wise in analogy to a pulsed shutter with variable pulse frequency and duty cycle. The adjustment of the opacity is performed via a power supply driver and controlled automatically by an automatic exposure unit connected to and/or part of a camera device that acquires the video images.

While the proposed electro- or magneto-optic light intensity filter device can be placed anywhere in the optical path, it is ideally located where the angle of incidence is small or even zero, i.e., where the light rays are parallel. This could be either inside an objective lens or between an objective lens and a camera sensor in a back telecentric optical system of the camera device.

The components of the filter can be selected and/or modified as follows:

1. The polarizers can be provided in form of linear absorptive polarizing filters.

Such filters are typically used in photography and commonly made from polyvinyl alcohol plastic with iodine doping chains aligned in one particular direction and laminated between optic-neutral hard foils or made form elongate silver nanoparticles embedded in thin, less than 0.5 mm, glass plates.

Malus's law given by the relation $I = I_0 \cos^2 \alpha$ describes the intensity of light, I, that passed through a linear absorptive polarizing filter having entered as linear polarized light, depending on its initial intensity, $I_0$, and the angle α between the initial polarization orientation of the light and the polarization orientation of the polarizing filter. Respectively, since the average value (or the integral over all angles) of $\cos^2 \alpha$ is 0.5, unpolarized light, i.e., light with a uniform mixture of linear polarizations at all possible angles, turns into polarized light remaining half of its initial intensity.

2. An electro- or magneto-optic polarization modulator can be provided in form of a Pockels cell.

Conventional Pockels cells often consist of very thick crystals that require high voltages. In order to reduce the required voltage it is proposed to cascade multiple thin layers of crystal, like potassium dihydrogenphosphate, coated with thin, transparent electrodes, for example made of indium tin oxide, and separated through a non-conducting, transparent layer.

Intensity modulation through electro-optical polarization modulation in combination with two polarizers is a standard method in the field of laser technology. When modulating a laser beam, the beam only goes directly through the center of the Pockels cell and lens errors that impede two-dimensional optical imaging are not relevant for the modulation of a single beam. But, the use of Pockels cells, Kerr cells, Liquid Crystal cells, or cells utilizing the magneto-optic Faraday effect, the Voigt effect or the Cotton-Mouton effect for camera imaging for mitigation of flicker is new.

A setup with an electro- or magneto-optical polarization modulator comprising a Pockels cell, a Kerr cell, a Liquid Crystal cell, or a cell utilizing the magneto-optic Faraday effect, the Voigt effect or the Cotton-Mouton effect allows two-dimensional imaging. For example, crystals like potassium dihydrogenphosphate used for Pockels cells typically have a high optical extinction and therewith large lens errors. But, under small angles of incidence sharp images with good contrast can, nevertheless, be acquired.

It is an advantage that the filter makes usage of cheap raw materials, works at almost all temperatures to which a motor vehicle can be exposed, does not contain any moving parts, is electrically infinitely variable tunable, and can switch within nanoseconds. Thus, it is superior to setups with moving parts like filter wheels in aspects of mechanical sensitivity, flexibility and switching time. As the acquisition gaps between two frames are shrinked or closed by setting the exposure time to be equal or longer than an oscillating light source's period duration or to be as long as possible between two frames in the image acquisition of streamed video images the loss of information about the average intensity of the light source is reduced. In contrast, known software-based solutions have to rely on incomplete data and therewith can only arbitrarily fill the gaps by altering the image sequences based on assumption, rather than actually recovering the data.

BRIEF DESCRIPTION OF THE DRAWINGS

The invention may be best understood with reference to the following description of embodiments taken together with the accompanying schematic drawings.

DETAILED DESCRIPTION

An electro- or magneto-optic modulated anti-flicker filter device is suited for a camera system, in particular a camera device used within an automotive environment, preferably within a rear view device.

Figure 1:
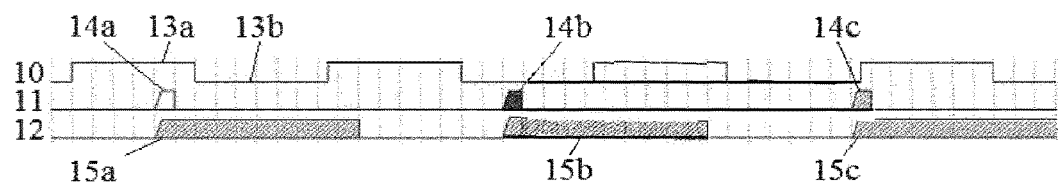
FIG. 1 is a comparison of time diagrams depicting light intensity from an oscillating light source and light exposure times of a camera.
Figure 2A:
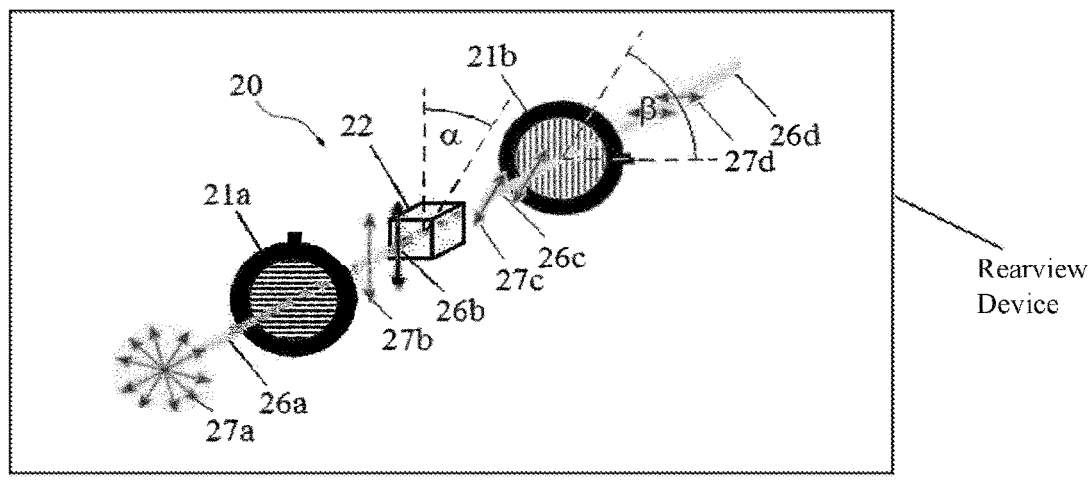
FIG. 2a is a perspective view of an electro- or magneto-optic light intensity filter.

FIG. 2a shows an embodiment of an electro- or magneto-optic light intensity filter 20 which is suited to prevent overexposure. The intensity filter 20 comprises a first polarizer 21a, an electro- or magneto-optic modulator 22, and a second polarizer 21b. Incoming light 26a from a not shown light source is provided with a uniform mixture of linear polarizations 27a at all possible angles and passes the first polarizer 21a such that it turns into polarized light 26b with a first polarization 27b prior to entering the electro- or magneto-optic modulator 22. By passing the first polarizer 21a the initial intensity of the incoming light 26a is reduced by about half. Depending on the voltage or current applied to the modulator 22 the first polarization 27b of the polarized light 26b is altered by an angle α and leaves the modulator 22 as modulated light 26c with a second polarization 27c prior to entering the second polarizer 21b. Depending on the orientation of the second polarization 27c in relation to the orientation of the second polarizer 21b the intensity of the outgoing light 26d is reduced or shut off. In other words, the light intensity of the outgoing light 26d, $I_2$, is given by the relation $$I_2 = I_1 \cos^2\beta, \text{ wherein}$$

$I_1$ is the light intensity of the modulated light 26c before passing the second polarizer 21b and β is the angle between the polarization orientation of the second polarization 27c and the polarization orientation of the second polarizer 21b. The outgoing light 26d features a third polarization 27d determined by the orientation of the second polarizator 21b.

Figure 2B:
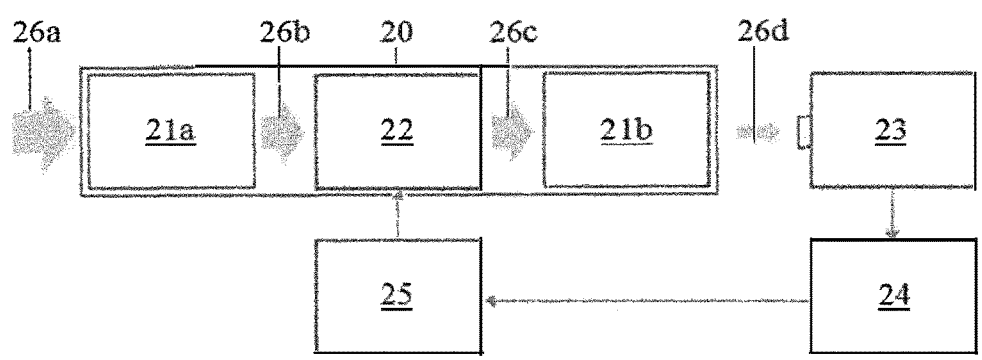
FIG. 2b is a block diagram of a modulation control method.

In FIG. 2b a block diagram of a modulation control method is described. Said method makes usage of the electro- or magneto-optic light intensity filter 20 shown in FIG. 2a and a camera device 23, an auto exposure unit 24 as well as a power supply driver 25.

Incoming light 26a passes through the intensity filter 20 as described above and leaves the same as outgoing light 26d that is captured by the camera device 23. The auto exposure unit 24 is connected to and/or part of said camera device 23 that detects an overexposure during an image acquisition and controls the power supply driver 25 which modulates the light intensity by applying voltage or current to the electro- or magneto-optic modulator 22, and, thus, prevents overexposure during the image acquisition process.

Although modifications and changes may be suggested by those skilled in the art, it is the intention of the application to embody within the patent warranted here on all changes and modifications as reasonably and probably come within the scope of this contribution to the art. The features of the present invention which are believed to be novel are set forth in detail in the appended claims. The features disclosed in the description, the figures as well as the claims could be essential alone or in every combination for the realization of the invention in its different embodiments.

What is claimed is:

1. A modulation control method for a filter device for avoiding flicker appearing in streamed video images before acquiring images, the method comprising:
    setting an exposure time to be equal or longer than an oscillating light source's period duration or to be as long as possible between two frames in an image acquisition of streamed video images;
    polarizing by a first polarizer incoming light to turn into polarized light with a first polarization;
    altering by an electro- or magneto-optic modulator coupled to the first polarizer the polarization of the light with the first polarization by an angle α to turn into light with a second polarization, the altering of the first polarization depending on a voltage or current applied to the modulator; and
    reducing by a second polarizer coupled to the electro- or magneto-optic modulator an amount of light with the second polarization with the remaining intensity of the outgoing light $I_2$ being $I_2 = I_1 \cos^2\beta$,
    wherein $I_1$ is a light intensity before passing the second polarizer and β is an angle between the polarization orientation of the light and the polarization orientation of the second polarizer.

2. The method of claim 1, wherein the polarizing within the first polarizer is accompanied by an absorption of light with the first polarization to 0.5 of its initial intensity.

3. The method of claim 1, wherein the altering within the electro- or magneto-optic modulator is accompanied by an absorption of light depending on a transmittance τ of a material of the electro- or magneto-optic modulator.

4. The method of claim 1, wherein the altering of the first polarization comprises:
    capturing the outgoing light with a camera device with a maximal exposure time between subsequent image acquisitions;
    detecting an amount of captured outgoing light during an image acquisition with an auto exposure unit; and
    applying a voltage or current to the electro- or magneto-optic modulator by a power supply driver depending on the detected amount of captured outgoing light.

5. The method of claim 4, wherein the voltage or current applied to the electro- or magneto-optic modulator is controlled by the auto exposure unit to alter the polarization of the light passing the electro- or magneto-optic modulator and thereby tune an amount of outgoing light.

6. The method of claim 1, wherein the reducing the amount of light with the second polarization is accompanied by an absorption of light.

7. The method of claim 1, wherein the light intensity is controlled by at least one of the absorption of the light with the first polarization and the light with the second polarization, step-less or step-wise.

8. The method of claim 7, wherein during the step-wise control of the light intensity, at least one of pulse frequency and duty cycle of the respective steps is controlled.

9. An electro- or magneto-optic light intensity filter for performing a modulation control method according claim 1, the filter comprising:
    a first polarizer;
    an electro- or magneto-optic modulator; and
    a second polarizer.

10. The filter device of claim 9, wherein the electro- or magneto-optic modulator comprises a Pockels cell, Kerr cell, Liquid Crystal cell, or a cell utilizing the magneto-optic Faraday effect, the Voigt effect or the Cotton-Mouton effect.

11. The filter device of claim 9, wherein at least one of the first polarizer comprises a linear absorptive polarizing filter or the second polarizer comprises a linear absorptive polarizing filter.

12. The filter device of claim 9, wherein the first polarizer and the second polarizer have the same polarization orientation.

13. A camera system, comprising
    at least one camera device; and
    a filter device according to claim 9,
    wherein at least one auto exposure unit is at least one of connected to or part of the at least one camera device, with the auto exposure unit being connected to a power supply driver.

14. A rear view device for a motor vehicle with a camera system according to claim 13.

15. A filter device for avoiding flicker appearing in streamed video images before acquiring images, the filter device capable of setting an exposure time to be equal or longer than an oscillating light source's period duration or to be as long as possible between two frames in an image acquisition of streamed video images, the filter device comprising:
- a first polarizer configured to polarize incoming light to generate polarized light with a first polarization;
- an electro- or magneto-optic modulator configured to alter the polarization of the light with the first polarization by an angle α to generate light with a second polarization, the altering of the first polarization depending on a voltage or current applied to the modulator; and
- a second polarizer configured to reduce an amount of light with the second polarization to generate outgoing light $I_2$, the remaining intensity of the outgoing light $I_2$ being $I_2 = I_1 \cos^2\beta$,
- wherein $I_1$ is a light intensity before passing the second polarizer and β is an angle between the polarization orientation of the light and the polarization orientation of the second polarizer.

16. The filter device of claim 15, wherein the polarizing within the first polarizer is accompanied by an absorption of light with the first polarization to 0.5 of its initial intensity.

17. The filter device of claim 15, wherein the altering within the electro- or magneto-optic modulator is accompanied by an absorption of light depending on a transmittance τ of a material of the electro- or magneto-optic modulator.

18. The filter device of claim 15, wherein the altering of the first polarization comprises:
- capturing the outgoing light with a camera device with a maximal exposure time between subsequent image acquisitions;
- detecting an amount of captured outgoing light during an image acquisition with an auto exposure unit; and
- applying a voltage or current to the electro- or magneto-optic modulator by a power supply driver depending on the detected amount of captured outgoing light.

19. The filter device of claim 18, wherein the voltage or current applied to the electro- or magneto-optic modulator is controlled by the auto exposure unit to alter the polarization of the light passing the electro- or magneto-optic modulator and thereby tune an amount of outgoing light.

20. The filter device of claim 15, wherein the reducing the amount of light with the second polarization is accompanied by an absorption of light.

21. The filter device of claim 15, wherein the light intensity is controlled by at least one of the absorption of the light with the first polarization and the light with the second polarization, step-less or step-wise.

22. The filter device of claim 21, wherein during the step-wise control of the light intensity, at least one of pulse frequency and duty cycle of the respective steps is controlled.

23. The filter device of claim 15, wherein the electro- or magneto-optic modulator comprises a Pockels cell, Kerr cell, Liquid Crystal cell, or a cell utilizing the magneto-optic Faraday effect, the Voigt effect or the Cotton-Mouton effect.

24. The filter device of claim 15, wherein at least one of the first polarizer comprises a linear absorptive polarizing filter or the second polarizer comprises a linear absorptive polarizing filter.

25. The filter device of claim 15, wherein the first polarizer and the second polarizer have the same polarization orientation.

* * * * *